United States Patent [19]

Mariani

[11] Patent Number: 5,239,517

[45] Date of Patent: Aug. 24, 1993

[54] SAW TRANSDUCER WITH COPLANAR WAVEGUIDE TRANSITION

[75] Inventor: Elio A. Mariani, Hamilton Square, N.J.

[73] Assignee: The United States of America as represented by the Secretary of the Army, Washington, D.C.

[21] Appl. No.: 936,377

[22] Filed: Aug. 28, 1992

[51] Int. Cl.⁵ .................................... H04R 17/00
[52] U.S. Cl. ........................... 367/140; 310/313 R; 310/313 B; 333/34; 333/194; 333/195; 333/212
[58] Field of Search .......... 310/313 R, 313 B, 313 C, 310/313 D; 331/155; 333/34, 194, 195, 203, 212, 208; 367/140

[56] References Cited

U.S. PATENT DOCUMENTS 4,906,953 3/1990 Li et al. ............................ 333/33

Primary Examiner—J. Woodrow Eldred
Attorney, Agent, or Firm—Michael Zelenka; William H. Anderson

[57] ABSTRACT

Disclosed is a coplanar waveguide (CPW) which is connected directly into a "balanced SAW transducer" via a tapered coplanar transmission line. Preferably, the CPW transition feeds directly into the "balanced transducer" such that the ground planes of the CPW taper directly into the outer (grounded) bus bars of the SAW transducer and the center conductor of the CPW feeds directly into the "hot" center electrode structure of the SAW transducer. This preferred structure is shown in FIG. 1. This balanced SAW transducer configuration provides better electrical shielding for lower electromagnetic feedthrough suppression and lower spurious signal levels. Moreover, the acoustic wave generated by this "balanced transducer" configuration provides a more uniform acoustic power distribution because the center conductor of the SAW transducer provides a waveguide effect wherein the acoustic energy tends to follow the slow velocity metal structure, thus forming an acoustic waveguide.

1 Claim, 2 Drawing Sheets

SAW TRANSDUCER WITH COPLANAR WAVEGUIDE TRANSITION

GOVERNMENT INTEREST

The invention described herein may manufactured, used and/or leased by, or behalf of, the U.S. Government without the payment to me of any royalties thereon.

FIELD OF THE INVENTION

This invention relates generally to analog signal processing and surface acoustic wave (SAW) devices and more particularly to the interconnection between SAW transducers and RF connectors.

BACKGROUND OF THE INVENTION

Heretofore several different types of interdigitated SAW transducers have been disclosed. The most generic of these transducers consists of two sets of interleaved electrodes, called fingers, deposited on a piezoelectric substrate. A portion of a typical SAW transducer configuration is shown in FIG. 2a. To generate an acoustic surface wave, an rf signal is applied applied to the transducer summing bars connecting sets of fingers as represented by numerals 12 in FIGS. 1, 2a and 2b), which are generally spaced by a distance equal to one-half the acoustic wavelength. A typical 100 Mhz transducer fabricated on a lithium niobate ($LiNbO_3$) substrate would have aluminum fingers tenths of a micrometer ($\mu$meter) thick by approximately ten $\mu$meters wide separated by approximately ten $\mu$meters. Of course, this simple is merely used as an illustration since there are a multitude of transducer configurations all of which will depend on frequency and performance specifications.

One problem, however, found in most SAW transducer designs, which operate at high rf frequencies, is the parasitic effects caused by stray capacitance and inductance. These parasitic effects, which distort the desired filter/device response, have been attributed to wire bonds needed to connect the rf media to the transducer(s). These undesirable parasitic effects caused by the microscopic wire bonds depend on factors like wire length, shape and placement and therefore, these parasitic effects vary with each transducer design. As a result, those skilled in the art would find it desirable to have a method and/or apparatus which connects a SAW transducer to the rf media without the need for any wire bonding. The present invention fulfills such a need.

SUMMARY OF THE INVENTION

Accordingly, one object of the present invention is to eliminate the parasitic effects caused by wire bonding to transducers.

Another object of the present invention is to provide for a low cost, easily manufacturable planar configuration for interconnecting the rf media to the acoustic via the SAW transducer.

These and other objects of the present invention are accomplished by the use of a coplanar waveguide (CPW) which is connected directly into a "balanced transducer" configuration via a tapered section of CPW. Preferably, the CPW transition feeds directly into the "balanced transducer" such that the ground planes of the CPW taper directly to the outer (grounded) bus bars of the SAW transducer and the center conductor of the CPW feeds directly into the "hot" center electrode structure of the SAW transducer. This preferred structure is shown in FIG. 1.

This balanced transducer configuration provides better electrical shielding for lower electromagnetic feedthrough suppression and lower spurious signal levels. Moreover, the acoustic wave generated by this "balanced transducer" configuration provides a more uniform acoustic power distribution because the counter conductor of the SAW transducer provides a waveguide effect wherein the acoustic energy tends to follow the structure with slower acoustic velocity and thus forms an acoustic waveguide.

BRIEF DESCRIPTION OF THE DRAWINGS

These and other features, objects, and advantages of the present invention will be more fully apparent from the detailed description set forth below taken in conjunction with the drawings in which like reference numerals identify like elements of the present invention wherein.

It must be noted that the elements depicted in the above mentioned figures have been enlarged for purposes of illustration.

DETAILED DESCRIPTION OF THE INVENTION

Figure 1:
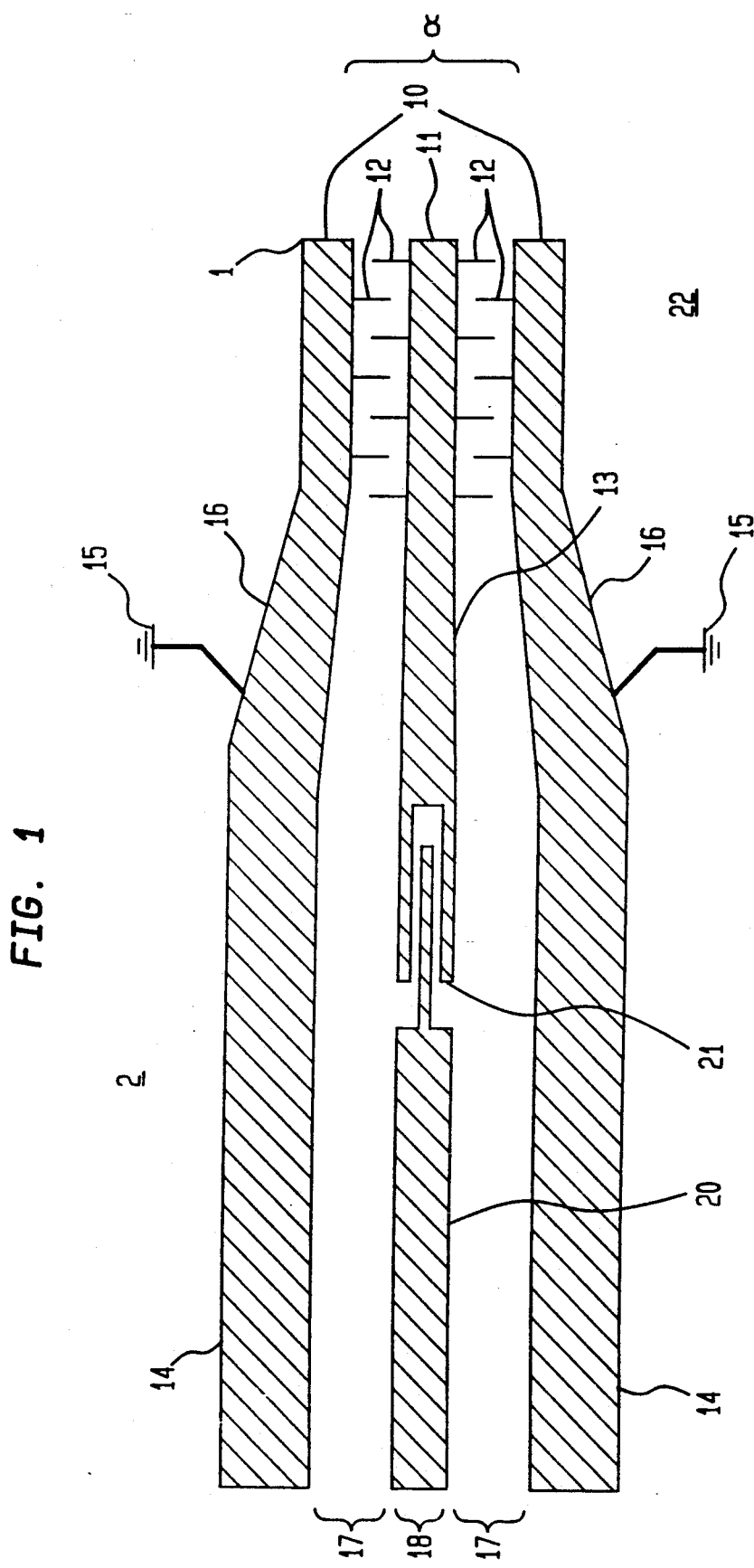
FIG. 1 is a schematic illustration of the preferred embodiment of the present invention.

Referring now to FIG. 1, there is shown a schematic illustration of the preferred embodiment of the present invention. As shown, a coplanar waveguide structure 2 is directly connected to a balanced SAW transducer 1 via tapered conductors 16 and 13.

Coplanar waveguide structures are well known in the art and are more fully explained in publications such as *Microstrip Lines and Slotlines*, K. C. Gupta et al., Artech House, 1979. As embodied in the present invention, coplanar waveguide structure 2 includes two ground planes 14 disposed equidistantly on either side of center conductor 20. The dimensions and spacing between the two ground planes 14 and center conductor 20 will depend on several factors including substrate 22 permittivity, impedance, and thickness of the substrate 22. As an example and assuming a lithium niobate ($LiNbO_3$) substrate 22 with relative permittivity ($\epsilon_r$) of 44, an impedance ($Z_o$) of 50$\Omega$, and a ratio of substrate thickness compared to ground plane spacing width 17 of 1, the ground plane spacing width 17 should equal 0.050 inches and the width 18 of center conductor 20 will equal 0.010 inches as calculated using the design parameters found in Gupta et al. Similarly, the length of the series matching inductance element 21 may also be calculated using the design parameters found in Gupta et al.

Coplanar waveguide 2 is connected to balanced SAW transducer 1 such that tapered conductors 16 feed directly into outer grounded bus bars 10 and the center tapered conductor 13 feeds directly into the center electrode structure 11.

In operation, the CPW provides a planar 50 ohm transmission line that joins the SAW transducer, directly, without any bonding wires. The CPW is a TEM transmission line where the electric field radiates outward from the center conductor to the surrounding ground planes. A portion of the TEM electric field is in the substrate 22 and a portion above the substrate. The CPW transition into the "balanced" SAW transducer structure is straightforward given the structural similarities, whereby the CPW ground planes 16 become the grounded transducer bus bars 10 and the CPW center conductor 13 becomes the "hot" SAW electrode connection 11. In the SAW transducer, the electric field also radiates from the "hot" electrodes to the adjacent ground electrodes 10. The electric field in the SAW transducer also is in and above the substrate, as in the CPW. Thus, the CPW transition provides an effective rf connection to introduce the required rf signal to the SAW transducer, which in turn excites an acoustic surface wave.

The CPW structure can also incorporate an inductive matching element 21 to provide impedance matching between the 50 ohm CPW and the SAW transducer. For the physical and electrical constraints associated with lithium niobate ($\epsilon_r = 44$), the CPW structure would be most useful at operating frequencies near or above 1 GHz, where the parasitic effects of wire bonds become of great concern. At 1 GHz, the eighth wavelength inductive element would be approximately 0.2 inches long.

As stated above, this balanced transducer configuration provides better electrical shielding for lower electromagnetic feedthrough suppression and lower spurious signal levels.

Figure 2B:
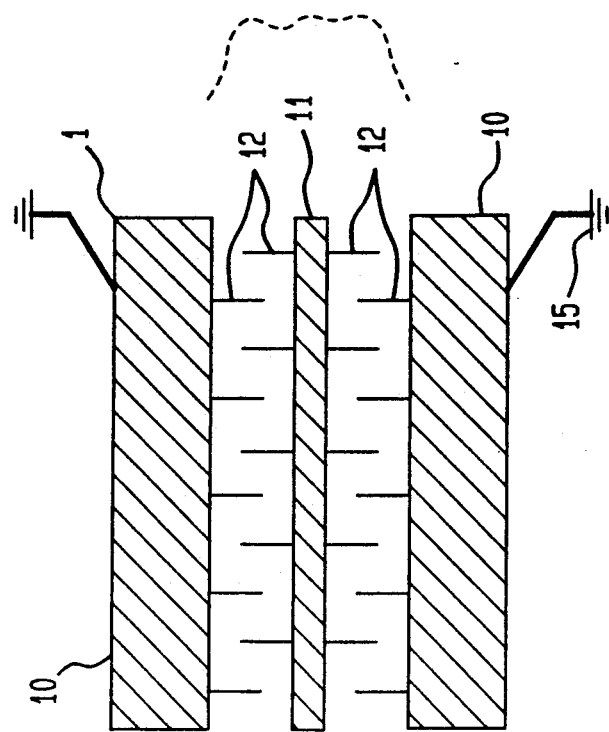
FIGS. 2a and 2b are schematic illustrations of a portion of SAW transducer configurations together with graphical representations of the acoustic power distributions for a conventional SAW transducer configuration (FIG. 2a) and for a SAW transducer configuration utilizing the concepts of the present invention.
Figure 2A:
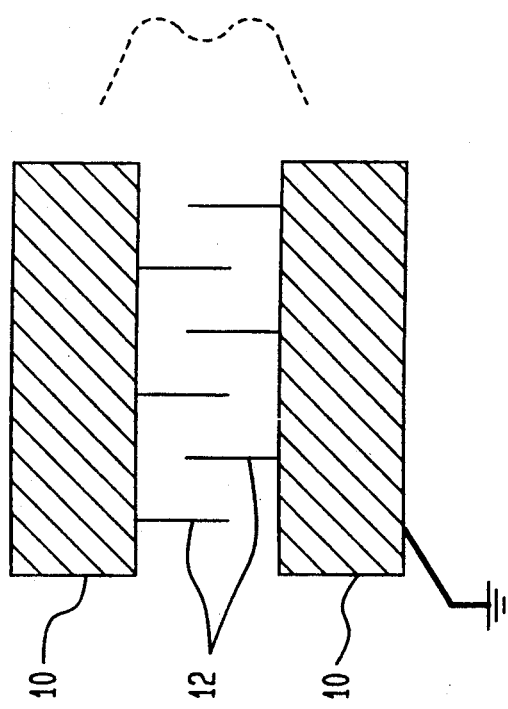

Referring now to FIGS. 2a and 2b, there is shown the arrangement of SAW transducer 1 and its acoustic power distribution (FIG. 2b) as compared to a conventional SAW transducer arrangement (FIG. 2a). As shown, utilization of a central electrode structure 11 contributes to a more uniform acoustic power distribution as compared to the acoustic power distribution associated with the conventional SAW transducer. This more uniform acoustic power distribution is attributed to the center electrode structure 11 which provides a waveguide effect wherein the acoustic energy tends to follow the metal structure with slower acoustic velocity thereby forming an acoustic waveguide.

The previous description of the preferred embodiment was provided to enable any person skilled in the art to make or use the present invention. Various modifications to this embodiment will be readily apparent to those skilled in the art, and the generic principles defined herein may be applied to other embodiments without the use of further inventive effort. Thus, the present invention is not intended to be limited to the embodiment described herein, but is to be accorded the widest scope consistent with the principles and novel features disclosed herein.

What is claimed is:

1. A surface acoustic wave transducer disposed on a piezoelectric substrate comprising:

a balanced surface acoustic wave transducer, the transducer comprising a central electrode structure, at least a first and second grounded bus bars mounted on either side of the central electrode structure and interdigitated electrodes extending alternately from both bus bars and the central electrode structure;

a coplanar waveguide directly connected to the transducer via tapered conductors, the coplanar waveguide comprising a central conductor which includes a series inductance matching element and at least a first and second ground planes mounted on either side of the central conductor, wherein the coplanar waveguide is connected to the transducer such that the first ground plane is directly connected to the first bus bar, the second ground plane is directly connected to the second bus bar, and the central conductor is directly connected to the central electrode structure.

* * * * *